(12) United States Patent
Okuda et al.

(10) Patent No.: US 12,273,994 B2
(45) Date of Patent: Apr. 8, 2025

(54) MULTILAYER SUBSTRATE MODULE WITH FILTER FUNCTION

(71) Applicant: Murata Manufacturing Co., Ltd., Nagaokakyo (JP)

(72) Inventors: Noriaki Okuda, Nagaokakyo (JP); Tomohiro Nagai, Nagaokakyo (JP); Kosuke Nishio, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 228 days.

(21) Appl. No.: 17/963,230

(22) Filed: Oct. 11, 2022

(65) Prior Publication Data

US 2023/0036907 A1    Feb. 2, 2023

Related U.S. Application Data

(63) Continuation of application No. PCT/JP2021/014798, filed on Apr. 7, 2021.

(30) Foreign Application Priority Data

May 7, 2020    (JP) .................................. 2020-082086

(51) Int. Cl.
*H05K 1/02* (2006.01)
*H05K 1/03* (2006.01)
(Continued)

(52) U.S. Cl.
CPC ......... *H05K 1/0298* (2013.01); *H05K 1/0242* (2013.01); *H05K 1/0256* (2013.01);
(Continued)

(58) Field of Classification Search
None
See application file for complete search history.

(56) References Cited

U.S. PATENT DOCUMENTS 5,818,313 A * 10/1998 Estes .................... H03H 7/0115
333/204
5,834,994 A * 11/1998 Shapiro ................ H03H 7/0115
333/204
(Continued)

FOREIGN PATENT DOCUMENTS

JP    H05109923 A  *  4/1993
JP    2003152490 A  *  5/2003  ........... H03H 7/0115
(Continued)

OTHER PUBLICATIONS

The Engineering ToolBox (2010). Relative Permittivity—the Dielectric Constant. [online] Available at: https://www.engineeringtoolbox.com/relative-permittivity-d_1660.html (Year: 2010).*

(Continued)

*Primary Examiner* — Binh B Tran
*Assistant Examiner* — Muhammed Azam
(74) *Attorney, Agent, or Firm* — Keating & Bennett, LLP

(57) ABSTRACT

A multilayer substrate module includes a first substrate portion including a first substrate portion body including first insulator layers stacked in a vertical direction and a first conductor layer and/or a first interlayer connection conductor provided at the first substrate portion body. A second substrate portion includes a second substrate portion body including second insulator layers stacked in the vertical direction and a second conductor layer and a second interlayer connection conductor provided at the second substrate portion body, and is mounted on an upper surface of the first substrate portion. A mount device is mounted on an upper surface or a lower surface of the second substrate portion. At least a portion of an inductance component is defined by the first conductor layer and the first interlayer connection conductor.

20 Claims, 10 Drawing Sheets

(51) Int. Cl.
    *H05K 1/05*              (2006.01)
    *H05K 1/18*              (2006.01)

(52) U.S. Cl.
    CPC ............. *H05K 1/0306* (2013.01); *H05K 1/05* (2013.01); *H05K 1/181* (2013.01)

(56) References Cited

U.S. PATENT DOCUMENTS

| | | | | |
|---|---|---|---|---|
| 5,910,755 | A * | 6/1999 | Mishiro | H05K 1/162 361/278 |
| 6,115,234 | A * | 9/2000 | Ishii | H03H 7/09 361/312 |
| 6,147,571 | A * | 11/2000 | Kitazawa | H01P 1/2135 333/204 |
| 6,207,905 | B1 * | 3/2001 | Taga | C03C 3/108 428/209 |
| 6,271,585 | B1 * | 8/2001 | Osada | H01L 23/3733 257/796 |
| 6,458,734 | B1 * | 10/2002 | Sugimoto | H05K 1/0306 361/321.5 |
| 6,534,842 | B2 * | 3/2003 | Ibata | H01F 27/2804 361/270 |
| 6,587,020 | B2 * | 7/2003 | Tojyo | H03H 7/1775 333/204 |
| 6,661,312 | B2 * | 12/2003 | Orihara | H03H 7/0115 333/204 |
| 6,818,469 | B2 * | 11/2004 | Mori | H05K 1/185 257/306 |
| 7,038,143 | B2 * | 5/2006 | Utsumi | H05K 3/4655 361/313 |
| 7,312,676 | B2 * | 12/2007 | Kundu | H03H 7/1725 333/204 |
| 7,450,395 | B2 * | 11/2008 | Sakai | H01L 25/165 361/728 |
| 7,508,285 | B2 * | 3/2009 | Kokubo | H03H 7/0115 333/175 |
| 7,755,447 | B2 * | 7/2010 | Oshima | H01P 5/10 333/26 |
| 7,902,941 | B2 * | 3/2011 | Ono | H01P 1/20345 333/204 |
| 7,924,116 | B2 * | 4/2011 | Ono | H03H 7/0123 333/132 |
| 8,692,125 | B2 * | 4/2014 | Kato | H05K 1/09 174/254 |
| 8,975,983 | B2 * | 3/2015 | Masuda | H01P 1/20345 333/175 |
| 9,013,249 | B2 * | 4/2015 | Imamura | H03H 7/12 333/185 |
| 9,178,484 | B2 * | 11/2015 | Masuda | H03H 7/1775 |
| 9,252,737 | B2 * | 2/2016 | Imamura | H03H 7/12 |
| 9,306,529 | B2 * | 4/2016 | Imamura | H03H 7/1775 |
| 9,419,579 | B2 * | 8/2016 | Mizoguchi | H03H 7/0115 |
| 9,462,678 | B2 * | 10/2016 | Wakabayashi | H01P 3/081 |
| 10,103,092 | B2 * | 10/2018 | Yosui | H01L 24/16 |
| 10,109,571 | B2 * | 10/2018 | Fukui | H05K 3/4682 |
| 10,110,193 | B2 * | 10/2018 | Masuda | H03H 7/0115 |
| 10,389,329 | B2 * | 8/2019 | Shiokawa | H01F 27/40 |
| 10,448,502 | B2 * | 10/2019 | Kim | H05K 1/0393 |
| 11,067,600 | B2 * | 7/2021 | Takemura | G01R 1/07378 |
| 11,136,259 | B2 * | 10/2021 | Kanbara | C03C 3/068 |
| 11,178,765 | B2 * | 11/2021 | Baba | H01L 23/49833 |
| 11,406,025 | B2 * | 8/2022 | Fujita | H05K 1/165 |
| 2007/0152780 | A1 * | 7/2007 | Liao | H01P 1/20345 333/204 |
| 2012/0002380 | A1 | 1/2012 | Kato | |
| 2015/0094009 | A1 | 4/2015 | Yosui et al. | |
| 2015/0380848 | A1 | 12/2015 | Kato | |
| 2016/0014903 | A1 | 1/2016 | Kato | |
| 2016/0313393 | A1 * | 10/2016 | Takemura | H05K 1/0268 |
| 2016/0323996 | A1 * | 11/2016 | Takemura | G01R 31/2889 |
| 2019/0037696 | A1 * | 1/2019 | Yamada | H01G 4/12 |
| 2022/0173054 | A1 * | 6/2022 | Stacey | H05K 1/181 |
| 2022/0209736 | A1 * | 6/2022 | Ogawa | H03H 7/0161 |
| 2023/0022402 | A1 * | 1/2023 | Ikemoto | H01P 3/085 |

FOREIGN PATENT DOCUMENTS

| | | | | |
|---|---|---|---|---|
| JP | 2006237231 A | | 9/2006 | |
| KR | 20030014646 A | * | 2/2003 | |
| KR | 20100050563 A | * | 5/2010 | |
| WO | WO-9422281 A1 | * | 9/1994 | ......... H01F 17/0006 |
| WO | 2010106839 A1 | | 9/2010 | |
| WO | WO-2010122930 A1 | * | 10/2010 | ......... H01F 17/0013 |
| WO | 2014024761 A1 | | 2/2014 | |
| WO | 2014185194 A1 | | 11/2014 | |
| WO | 2015033704 A1 | | 3/2015 | |
| WO | WO-2022182186 A1 | * | 9/2022 | ......... H05K 1/0283 |

OTHER PUBLICATIONS

International Search Report in PCT/JP2021/014798, mailed Jun. 29, 2021, 3 pages.

Written Opinion in PCT/JP2021/014798, mailed Jun. 29, 2021, 5 pages.

* cited by examiner

MULTILAYER SUBSTRATE MODULE WITH FILTER FUNCTION

CROSS REFERENCE TO RELATED APPLICATIONS

This application claims the benefit of priority to Japanese Patent Application No. 2020-082086, filed on May 7, 2020, and is a Continuation application of PCT Application No. PCT/JP2021/014798, filed on Apr. 7, 2021. The entire contents of each application are hereby incorporated herein by reference.

BACKGROUND OF THE INVENTION

1. Field of the Invention

The present invention relates to a multilayer substrate module having a filter function.

2. Description of the Related Art

As an invention relating to a conventional multilayer substrate module, for example, a branch cable described in International Publication No. WO 2014/024761 is known. The branch cable includes dielectric element bodies and band element filters. The dielectric element bodies are a multilayer substrate with flexibility. The band element filters are provided in the multilayer substrate. The band element filters each have an inductance component and a capacitance component.

In the branch cable described in International Publication No. WO 2014/024761, the dielectric element bodies have flexibility. When the dielectric element bodies are deformed, capacitance values of the capacitance components of the band element filters change.

SUMMARY OF THE INVENTION

Preferred embodiments of the present invention are able to reduce a change in a capacitance component in a multilayer substrate module having a filter function.

A multilayer substrate module according to a preferred embodiment of the present invention has a filter function including an inductance component and a capacitance component, the multilayer substrate module including a first substrate portion that includes a first substrate portion body including a structure in which a plurality of first insulator layers are stacked in a vertical direction and a first conductor layer and/or a first interlayer connection conductor that is provided at the first substrate portion body, a second substrate portion that includes a second substrate portion body including a structure in which a plurality of second insulator layers are stacked in the vertical direction and a second conductor layer and/or a second interlayer connection conductor that is provided at the second substrate portion body, the second substrate portion being mounted on an upper surface of the first substrate portion, and a mount device that is mounted on an upper surface or a lower surface of the second substrate portion.

At least a portion of the inductance component is defined by the first conductor layer and/or the first interlayer connection conductor that is provided in the first substrate portion. The capacitance component is defined by the second conductor layer and/or the second interlayer connection conductor that is provided in the second substrate portion, and a Young's modulus of a material of the second insulator layers is higher than a Young's modulus of a material of the first insulator layers.

Definitions of terms in the present specification will be described below. In the present specification, an axis or a member extending in a front-back direction does not necessarily denote only an axis or a member parallel or substantially parallel to the front-back direction. An axis or a member extending in the front-back direction refers to an axis or a member inclined at an angle within the range of about ±45° with respect to the front-back direction. Similarly, an axis or a member extending in a vertical direction refers to an axis or a member inclined at an angle within the range of about ±45° with respect to the vertical direction. An axis or a member extending in a left-right direction refers to an axis or a member inclined at an angle within the range of about ±45° with respect to the left-right direction.

In the following description, a first member to a third member are members, components, or the like which a multilayer substrate module includes. In the present specification, portions of the first member will be defined in the following manner unless otherwise specified. A front portion of the first member means a front half of the first member. A back portion of the first member means a back half of the first member. A left portion of the first member means a left half of the first member. A right portion of the first member means a right half of the first member. An upper portion of the first member means an upper half of the first member. A lower portion of the first member means a lower half of the first member. A front end of the first member means an end in a forward direction of the first member. A back end of the first member means an end in a backward direction of the first member. A left end of the first member means an end in a leftward direction of the first member. A right end of the first member means an end in a rightward direction of the first member. An upper end of the first member means an end in an upward direction of the first member. A lower end of the first member means an end in a downward direction of the first member. A front end portion of the first member means the front end and its vicinity of the first member. A back end portion of the first member means the back end and its vicinity of the first member. A left end portion of the first member means the left end and its vicinity of the first member. A right end portion of the first member means the right end and its vicinity of the first member. An upper end portion of the first member means the upper end and its vicinity of the first member. A lower end portion of the first member means the lower end and its vicinity of the first member.

If two members in the present specification are defined as a first member and a second member, relationships between the two members have the following meanings. In the present specification, a case where the first member is supported by the second member includes a case where the first member is immovably attached (that is, fixed) to the second member and a case where the first member is movably attached to the second member. The case where the first member is supported by the second member includes both a case where the first member is directly attached to the second member and a case where the first member is attached to the second member via a third member.

In the present specification, a case where the first member is fixed to the second member includes the case where the first member is immovably attached to the second member and does not include the case where the first member is movably attached to the second member. The case where the first member is fixed to the second member includes both the case where the first member is directly attached to the second member and the case where the first member is attached to the second member via the third member.

In the present specification, the statement that "the first member and the second member are electrically connected" means that direct electrical current can flow between the first member and the second member. Thus, the first member and the second member may be in contact or the first member and the second member may be out of contact. If the first member and the second member are out of contact, the third member with conductivity is arranged between the first member and the second member.

Multilayer substrate modules according to preferred embodiments of the present invention makes it possible to reduce a change in capacitance component in a multilayer substrate module having a filter function.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8 is an exploded perspective view of an intermediate portion of the first substrate portion 12 of the multilayer substrate module 10a.

FIG. 9 is an exploded perspective view of the second substrate portion 14 of the multilayer substrate module 10a.

DETAILED DESCRIPTION OF THE PREFERRED EMBODIMENTS

Preferred Embodiment

Figure 1:
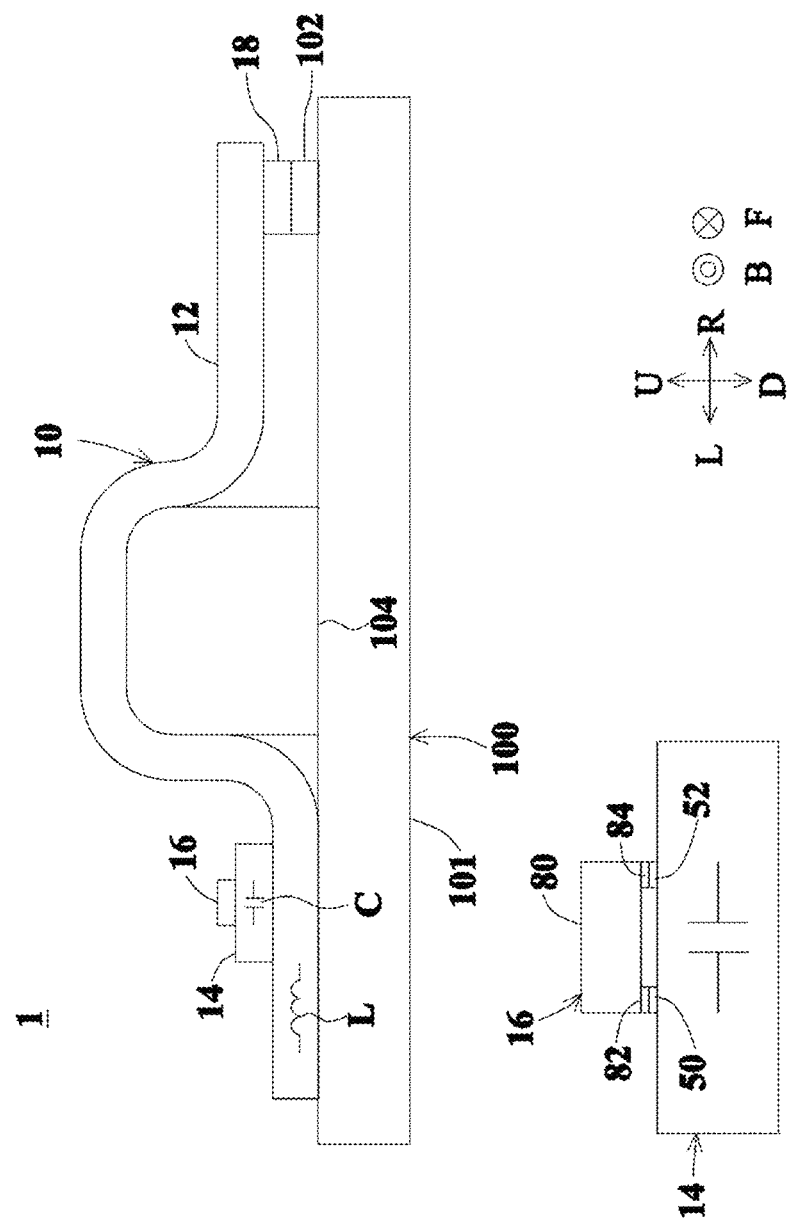
FIG. 1 is a front view of electronic equipment 1 including a multilayer substrate module 10 according to an example of a preferred embodiment of the present invention.
Figure 2:
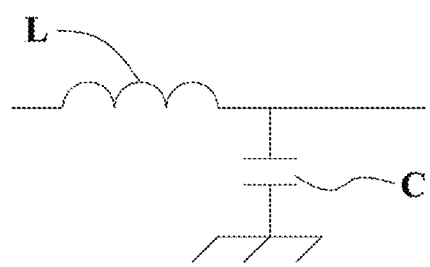
FIG. 2 is an equivalent circuit diagram of a filter function LPF which the multilayer substrate module 10 includes.
Figure 3:
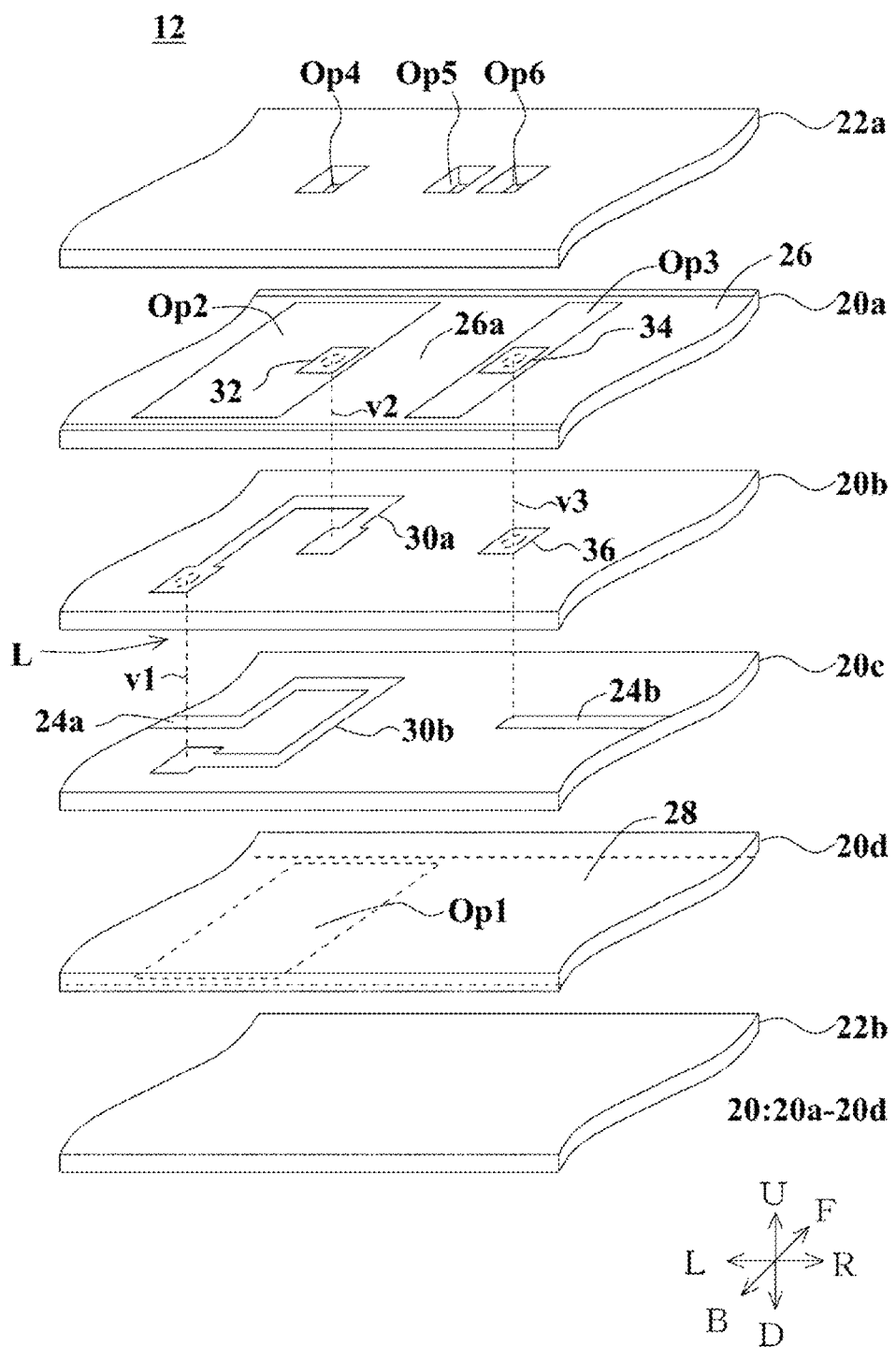
FIG. 3 is an exploded perspective view of an intermediate portion of a first substrate portion 12 of the multilayer substrate module 10.
Figure 4:
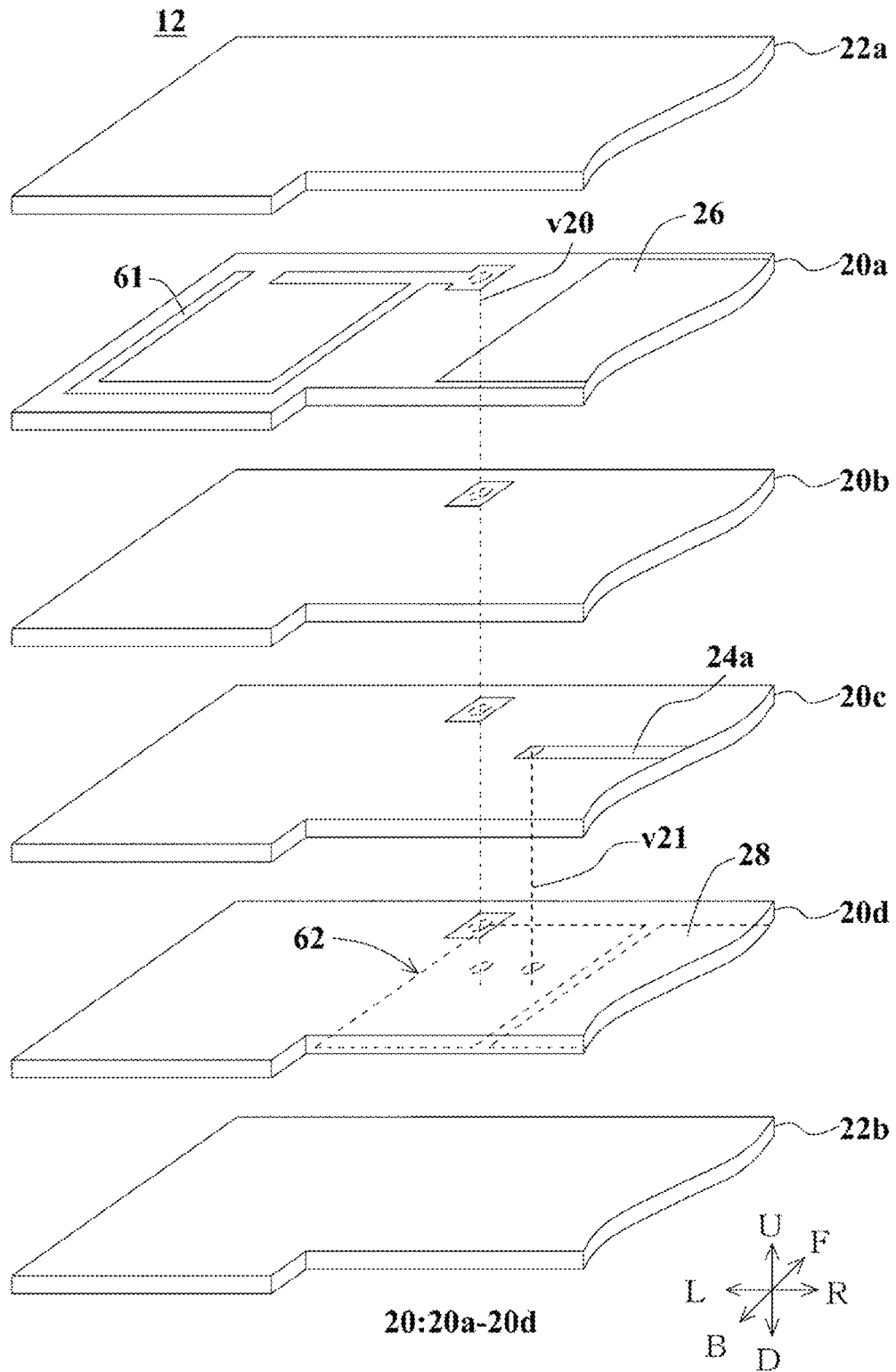
FIG. 4 is an exploded perspective view of a left end portion of the first substrate portion 12 of the multilayer substrate module 10.
Figure 5:
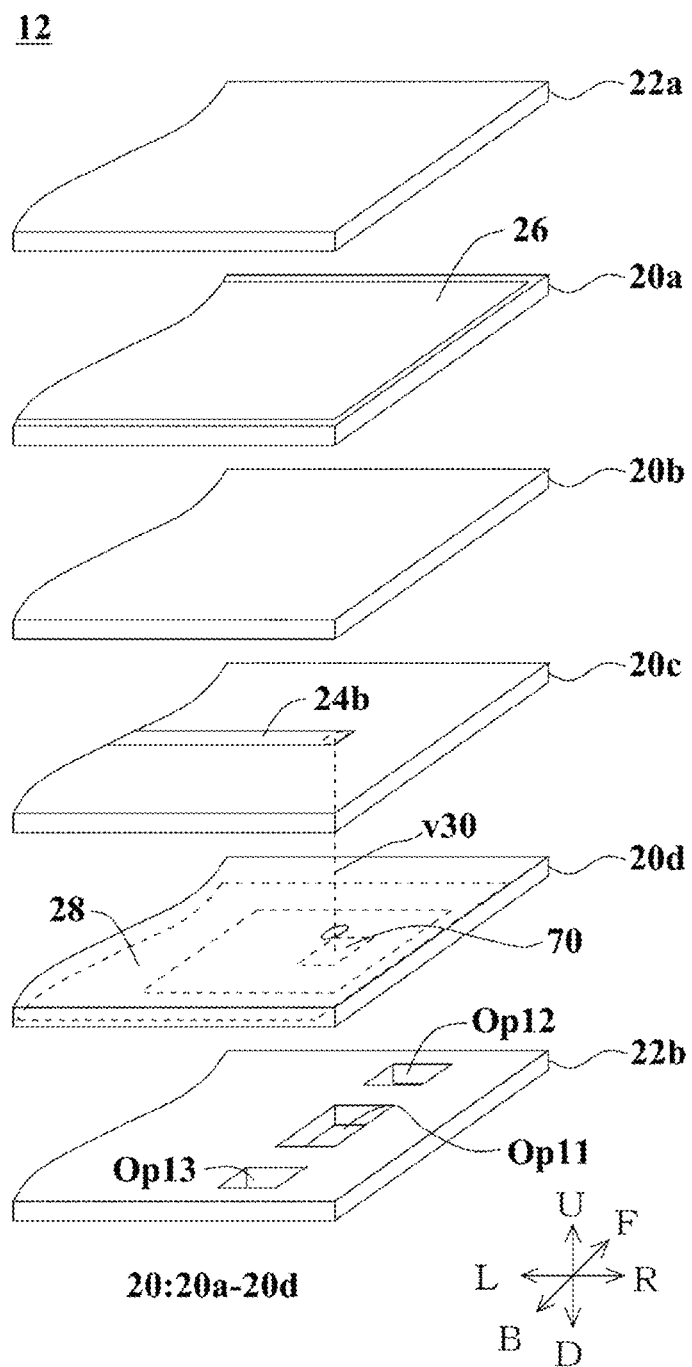
FIG. 5 is an exploded perspective view of a right end portion of the first substrate portion 12 of the multilayer substrate module 10.
Figure 6:
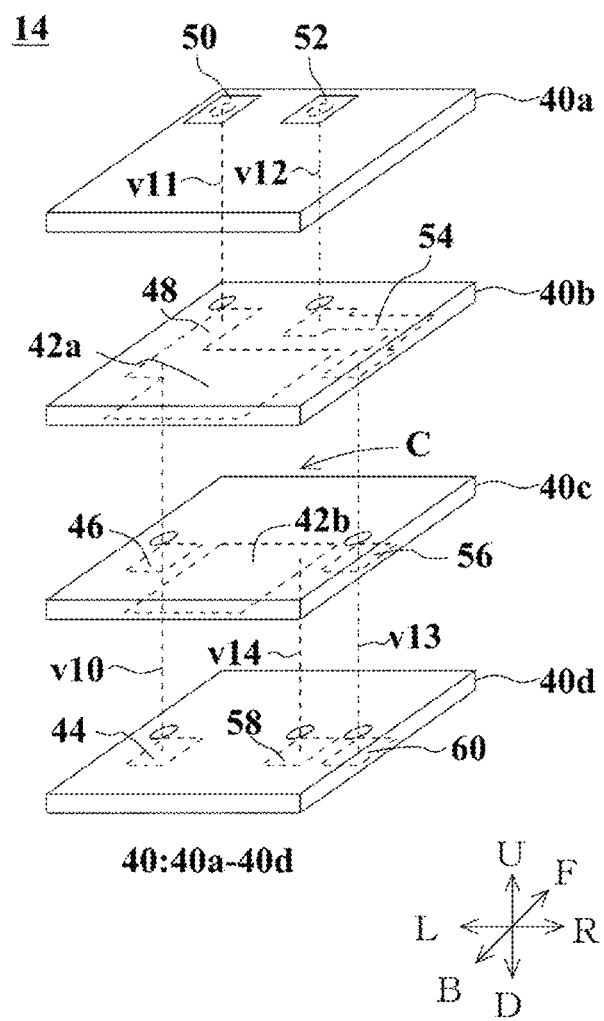
FIG. 6 is an exploded perspective view of a second substrate portion 14 of the multilayer substrate module 10.

A structure of a multilayer substrate module 10 according to a preferred embodiment of the present invention will be described below with reference to the drawings. FIG. 1 is a front view of an electronic equipment 1 including the multilayer substrate module 10. FIG. 2 is an equivalent circuit diagram of a filter function LPF which the multilayer substrate module 10 has. FIG. 3 is an exploded perspective view of an intermediate portion of a first substrate portion 12 of the multilayer substrate module 10. FIG. 4 is an exploded perspective view of a left end portion of the first substrate portion 12 of the multilayer substrate module 10. FIG. 5 is an exploded perspective view of a right end portion of the first substrate portion 12 of the multilayer substrate module 10. FIG. 6 is an exploded perspective view of a second substrate portion 14 of the multilayer substrate module 10.

In the present disclosure, directions will be defined in the following manner. A stacking direction of the first substrate portion 12 and a stacking direction of the second substrate portion 14 of the multilayer substrate module 10 are defined as a vertical direction (U⇆D). A longitudinal direction of the first substrate portion 12 is defined as a left-right direction (L⇆R). A transverse direction of the first substrate portion 12 is defined as a front-back direction (F⇆B). The vertical direction, the left-right direction, and the front-back direction are orthogonal or substantially orthogonal to one another. The definitions of the directions in the present specification are merely examples. Thus, directions in actually using the multilayer substrate module 10 need not coincide with the directions in the present specification.

The multilayer substrate module 10 is preferably used as a front-end module in the electronic equipment 1, such as, for example, a cellular phone, as shown in FIG. 1. More particularly, the electronic equipment 1 includes the multilayer substrate module 10 and a circuit board 100. The circuit board 100 is, for example, a multilayer substrate. The circuit board 100 includes a board body 101, a connector 102, and a mount device 104.

The board body 101 preferably has a plate shape. The board body 101 includes an upper surface and a lower surface. The board body 101 has a structure in which insulator layers are stacked in the vertical direction. In the board body 101, an electric circuit, such as, for example, wiring, a coil, or a capacitor, is defined by a conductor layer.

The connector 102 is mounted on the upper surface of the board body 101. In the present preferred embodiment, the connector 102 is preferably, for example, a coaxial connector. Thus, the connector 102 includes a central conductor (not shown) to which a high-frequency signal is applied and an outer conductor (not shown) which is connected to a ground potential.

The mount device 104 is mounted on the upper surface of the board body 101. The mount device 104 is, for example, a semiconductor integrated circuit (IC), an electronic component, or the like.

The multilayer substrate module 10 has the filter function LPF including an inductance component L and a capacitance component C shown in FIG. 2. In the present preferred embodiment, the filter function LPF is, for example, a low pass filter. Thus, the filter function LPF allows a high-frequency signal having a frequency lower than or equal to a cutoff frequency to pass through. The multilayer substrate module 10 includes the first substrate portion 12, the second substrate portion 14, a mount device 16, and a connector 18, as shown in FIG. 1.

The first substrate portion 12 preferably includes a first substrate portion body 20, resist layers 22a and 22b, first conductor layers 24a, 24b, 26, 28, 30a, 30b, 32, 34, 36, 61, 62, and 70, and first interlayer connection conductors v1 to v3, v20, v21, and v30, as shown in FIGS. 3, 4, and 5.

The first substrate portion body 20 has a plate shape. As shown in FIGS. 3, 4, and 5, the first substrate portion body 20 preferably has a rectangular or substantially rectangular shape including long sides extending in the left-right direction as viewed in a downward direction. A length in the left-right direction of the first substrate portion body 20 is thus longer than a length in the front-back direction of the first substrate portion body 20. The length in the front-back direction of the first substrate portion body 20 is longer than a length in the vertical direction of the first substrate portion body 20. The first substrate portion body 20 has flexibility. The first substrate portion body 20 can thus be bent in the vertical direction.

The first substrate portion body 20 includes a structure in which first insulator layers 20a to 20d are stacked in the vertical direction. The first insulator layers 20a to 20d are stacked such that the first insulator layers 20a to 20d are arranged in this order from top to bottom. The first insulator layers 20a to 20d are dielectric sheets with flexibility. Materials for the first insulator layers 20a to 20d are resin. In the present preferred embodiment, the materials for the first insulator layers 20a to 20d are a thermoplastic resin, such as, for example, a polyimide or a liquid crystal polymer. The first insulator layers 20a to 20d have the same or substantially the same rectangular or substantially rectangular shapes as the first substrate portion body 20 as viewed in the downward direction.

A resist layer 22a is stacked on the first insulator layer 20a. In the present specification, the resist layer 22a is not included in the first substrate portion body 20. The resist layer 22a covers an entirety or substantially an entirety of an upper surface of the first insulator layer 20a. A resist layer 22b is stacked underneath the first insulator layer 20d. The resist layer 22b is not included in the first substrate portion body 20. The resist layer 22b covers an entirety or substantially an entirety of a lower surface of the first insulator layer 20d. The resist layers 22a and 22b are protective layers. The resist layers 22a and 22b are made of materials different from the materials for the first insulator layers 20a to 20d.

The first conductor layers 24a, 24b, 26, 28, 30a, 30b, 32, 34, 36, 61, 62, and 70 are provided at the first substrate portion body 20. The first conductor layers 24a, 24b, 26, 28, 30a, 30b, 32, 34, 36, 61, 62, and 70 are formed by, for example, etching copper foil provided on upper surfaces or lower surfaces of the first insulator layers 20a to 20d.

The first interlayer connection conductors v1 to v3, v20, v21, and v30 are provided in the first substrate portion body 20. The first interlayer connection conductors v1 to v3, v20, v21, and v30 are preferably via hole conductors. The first interlayer connection conductors v1 to v3, v20, v21, and v30 are preferably formed by, for example, filling through-holes provided in the first insulator layers 20a to 20d with conductive paste containing a metal, such as silver, and resin and solidifying the conductive paste by heating. In this case, resin remains in the first interlayer connection conductors v1 to v3, v20, v21, and v30.

Details of the intermediate portion of the first substrate portion 12 will next be described with reference to FIG. 3. The first conductor layers 24a and 24b are signal conductor layers. Thus, a high-frequency signal is transmitted to the first conductor layers 24a and 24b. The first conductor layers 24a and 24b are provided on the upper surface of the first insulator layer 20c. The first conductor layers 24a and 24b have linear shapes as viewed in the downward direction. The first conductor layers 24a and 24b extend in the left-right direction in the middle in the front-back direction of the first insulator layer 20c. The first conductor layer 24a and the first conductor layer 24b are not physically connected. In the present specification, physical connection means that two members are in direct physical contact. Physical non-connection in the present specification means that two members are separate. A left end of the first conductor layer 24b is located to the right of a right end of the first conductor layer 24a. In the present specification, the statement that "the left end of the first conductor layer 24b is located to the right of the right end of the first conductor layer 24a" refers to the following state. At least a portion of the left end of the first conductor layer 24b is arranged in a region through which the first conductor layer 24a passes when the right end of the first conductor layer 24a is translated in a rightward direction. Thus, the left end of the first conductor layer 24b may fit in the region, through which the right end of the first conductor layer 24a passes when the right end of the first conductor layer 24a is translated in the rightward direction, or may protrude from the region, through which the right end of the first conductor layer 24a passes when the right end of the first conductor layer 24a is translated in the rightward direction. In the present preferred embodiment, the left end of the first conductor layer 24b fits in the region, through which the right end of the first conductor layer 24a passes when the right end of the first conductor layer 24a is translated in the rightward direction.

The first conductor layer 26 is a first ground conductor layer. Thus, the ground potential is connected to the first conductor layer 26. The first conductor layer 26 is provided on the upper surface of the first insulator layer 20a. The first conductor layer 26 covers the entirety or substantially the entirety of the upper surface of the first insulator layer 20a. With this configuration, the first conductor layer 26 overlaps with the first conductor layers 24a and 24b as viewed in the downward direction. Openings Op2 and Op3 are provided in the first conductor layer 26. The openings Op2 and Op3 are regions where no conductor layers are provided. The openings Op2 and Op3 have rectangular or substantially rectangular shapes as viewed in the downward direction. The opening Op3 is arranged to the right of the opening Op2.

The first conductor layer 28 is a second ground conductor layer. Thus, the ground potential is connected to the first conductor layer 28. The first conductor layer 28 is provided on the lower surface of the first insulator layer 20d. The first conductor layer 28 covers the entirety or substantially the entirety of the lower surface of the first insulator layer 20d. With this configuration, the first conductor layer 28 overlaps with the first conductor layers 24a and 24b as viewed in the downward direction. The first conductor layers 24a and 24b as the signal conductor layers, the first conductor layer 26 as the first ground conductor layer, and the first conductor layer 28 as the second ground conductor layer have a stripline structure. An opening Op1 is provided in the first conductor layer 28. The opening Op1 is a region where no conductor layer is provided. The opening Op1 has a rectangular shape as viewed in the downward direction. The opening Op1 overlaps with the opening Op2 in a state coincident therewith, as viewed in the downward direction.

The inductance component L in FIG. 2 is defined by the first conductor layers 30a and 30b and the first interlayer connection conductors v1 and v2 that are provided in the first substrate portion 12. The first conductor layer 30a is provided on the upper surface of the first insulator layer 20b. The first conductor layer 30b is provided on the upper surface of the first insulator layer 20c. The first conductor layer 30a and the first conductor layer 30b overlap with each other to form a rectangular or substantially rectangular trajectory, as viewed in the downward direction. In the following description, end portions on an upstream side in a clockwise direction of the first conductor layers 30a and 30b are defined as upstream end portions of the first conductor layers 30a and 30b. End portions on a downstream side in the clockwise direction of the first conductor layers 30a and 30b are defined as downstream end portions of the first conductor layers 30a and 30b. The upstream end portion of the first conductor layer 30a overlaps with the downstream end portion of the first conductor layer 30b as viewed in the downward direction. The upstream end portion of the first conductor layer 30b is connected to the right end of the first conductor layer 24a. The first conductor layers 30a and 30b overlap with the openings Op1 and Op2 as viewed in the downward direction. With this configuration, the first conductor layers 30a and 30b do not overlap with the first conductor layer 26 as the first ground conductor layer and the first conductor layer 28 as the second ground conductor layer as viewed in the downward direction. This inhibits formation of capacitances between the first conductor layers 30a and 30b and the first conductor layer 26 and between the first conductor layers 30a and 30b and the first conductor layer 28.

The first interlayer connection conductor v1 extends through the first insulator layer 20b in the vertical direction. The first interlayer connection conductor v1 connects the upstream end portion of the first conductor layer 30a and the downstream end portion of the first conductor layer 30b. With this configuration, the first conductor layers 30a and 30b are series-connected via the first interlayer connection conductor v1.

The first conductor layer 32 is an outer electrode. Thus, a high-frequency signal is preferably input to or output from the first conductor layer 32. The first conductor layer 32 is provided on the upper surface of the first insulator layer 20a. The first conductor layer 32 overlaps with the downstream end portion of the first conductor layer 30a as viewed in the downward direction. The first conductor layer 32 has a rectangular or substantially rectangular shape as viewed in the downward direction.

The first interlayer connection conductor v2 extends through the first insulator layer 20a in the vertical direction. The first interlayer connection conductor v2 connects the downstream end portion of the first conductor layer 30a and the first conductor layer 32. As described above, the first conductor layers 30a and 30b and the first interlayer connection conductors v1 and v2 have a helical shape having a central axis extending in the vertical direction. That is, the first conductor layers 30a and 30b and the first interlayer connection conductors v1 and v2 define a coil.

The first conductor layer 34 is an outer electrode. Thus, a high-frequency signal is input to or output from the first conductor layer 34. The first conductor layer 34 is provided on the upper surface of the first insulator layer 20a. The first conductor layer 34 is located to the right of the first conductor layer 32. The first conductor layer 34 overlaps with a left end portion of the first conductor layer 24b as viewed in the downward direction. The first conductor layer 34 has a rectangular or substantially rectangular shape as viewed in the downward direction.

The first conductor layer 36 is a connection conductor layer. The first conductor layer 36 is provided on the upper surface of the first insulator layer 20b. The first conductor layer 36 overlaps with the left end portion of the first conductor layer 24b and the first conductor layer 34 as viewed in the downward direction. The first conductor layer 36 has a rectangular or substantially rectangular shape as viewed in the downward direction.

The first interlayer connection conductor v3 extends through the first insulator layers 20a and 20b in the vertical direction. The first interlayer connection conductor v3 connects the first conductor layer 34, the first conductor layer 36, and the left end portion of the first conductor layer 24b.

Openings Op4, Op5, and Op6 are preferably provided in the resist layer 22a, as shown in FIG. 3. The opening Op4 overlaps with the first conductor layer 32 as viewed in the downward direction. The opening Op5 overlaps with an electrode portion 26a as viewed in the downward direction. The electrode portion 26a is a portion which is located between the first conductor layer 32 and the first conductor layer 34 in the first conductor layer 26. The ground potential is connected to the electrode portion 26a. The opening Op6 overlaps with the first conductor layer 34 as viewed in the downward direction. With this configuration, the first conductor layers 32 and 34 and the electrode portion 26a are exposed to the outside of the first substrate portion 12.

Details of the left end portion of the first substrate portion 12 will next be described with reference to FIG. 4. The first conductor layer 61 is preferably an antenna conductor layer, for example. Thus, the first conductor layer 61 defines and functions as an antenna which transmits and/or receives electromagnetic waves of a high-frequency signal. The first conductor layer 61 is provided on the upper surface of the first insulator layer 20a. The first conductor layer 61 has a shape obtained by cutting out a portion of a quadrilateral or substantially quadrilateral annular shape, as viewed in the downward direction.

First conductor layers 62 define a matching circuit. The first conductor layers 62 are provided on the lower surface of the first insulator layer 20d. A structure of the first conductor layers 62 has numerous variations. Additionally, the specific details of the matching circuit are not the essence of preferred embodiments of the present invention. Thus, the first conductor layers 62 are not illustrated in detail and are generally indicated by a rectangle. Note that the first conductor layers 62 may define the matching circuit together with a chip component (not shown). If the first conductor layer 61 as the antenna conductor layer is, for example, a patch antenna, the first conductor layers 62 defining the matching circuit are unnecessary.

The first interlayer connection conductor v20 extends through the first insulator layers 20a to 20d in the vertical direction. The first interlayer connection conductor v20 connects the first conductor layer 61 as the antenna conductor layer and the first conductor layers 62 as the matching circuit. The first interlayer connection conductor v21 extends through the first insulator layers 20c and 20d in the vertical direction. The first interlayer connection conductor v21 connects the first conductor layers 62 as the matching circuit and the left end portion of the first conductor layer 24a as the signal conductor layer. With this configuration, the first conductor layer 61 as the antenna conductor layer is electrically connected to the first conductor layer 24a as the signal conductor layer.

Details of the right end portion of the first substrate portion 12 will next be described with reference to FIG. 5. The first conductor layer 70 is an outer electrode. Thus, a high-frequency signal is input to or output from the first conductor layer 70. The first conductor layer 70 is provided on the lower surface of the first insulator layer 20d. The first conductor layer 70 overlaps with a right end portion of the first conductor layer 24b as viewed in the downward direction. The first conductor layer 70 has a rectangular or substantially rectangular shape as viewed in the downward direction.

The first interlayer connection conductor v30 extends through the first insulator layers 20c and 20d in the vertical direction. The first interlayer connection conductor v30 connects the right end portion of the first conductor layer 24b and the first conductor layer 70.

Openings Op11 to Op13 are provided in the resist layer 22b. The opening Op11 overlaps with the first conductor layer 70 as viewed in the downward direction. With this configuration, the first conductor layer 70 is exposed to the outside of the first substrate portion 12. The openings Op12 and Op13 overlap with the first conductor layer 28 as viewed in the downward direction. With this configuration, the first conductor layer 28 is exposed to the outside of the first substrate portion 12.

Details of the second substrate portion 14 will next be described with reference to FIG. 6. The second substrate portion 14 is provided on an upper surface of the first substrate portion 12. The second substrate portion 14 includes a second substrate portion body 40, second conductor layers 42*a*, 42*b*, 44, 46, 48, 50, 52, 54, 56, 58, and 60, and second interlayer connection conductors v10 to v14.

The second substrate portion body 40 preferably has a plate shape, for example. The second substrate portion body 40 has a rectangular or substantially rectangular shape including long sides extending in the left-right direction as viewed in the downward direction, as shown in FIG. 6. A length in the left-right direction of the second substrate portion body 40 is thus longer than a length in the front-back direction of the second substrate portion body 40. The length in the front-back direction of the second substrate portion body 40 is longer than a length in the vertical direction of the second substrate portion body 40.

The second substrate portion body 40 includes a structure in which second insulator layers 40*a* to 40*d* are stacked in the vertical direction. The second insulator layers 40*a* to 40*d* are stacked such that the second insulator layers 40*a* to 40*d* are arranged in this order from top to bottom. The second insulator layers 40*a* to 40*d* are ceramic sheets. Materials used to make the second insulator layers 40*a* to 40*d* are preferably, for example, ceramic. In the present preferred embodiment, the materials for the second insulator layers 40*a* to 40*d* are, for example, low temperature co-fired ceramics (LTCC). The second insulator layers 40*a* to 40*d* preferably have the same or substantially the same rectangular or substantially rectangular shapes as the second substrate portion body 40 as viewed in the downward direction.

Here, Young's moduli of the materials for the second insulator layers 40*a* to 40*d* are higher than Young's moduli of the materials for the first insulator layers 20*a* to 20*d*. The Young's moduli of the materials for the second insulator layers 40*a* to 40*d* are, for example, about 100 GPa. The Young's moduli of the materials for the first insulator layers 20*a* to 20*d* are, for example, about 5 GPa. With this configuration, the second substrate portion body 40 is less flexible than the first substrate portion body 20. Further, relative dielectric constants of the materials for the second insulator layers 40*a* to 40*d* are higher than relative dielectric constants of the materials for the first insulator layers 20*a* to 20*d*.

The second conductor layers 42*a*, 42*b*, 44, 46, 48, 50, 52, 54, 58, and 60 are provided at the second substrate portion body 40. The second conductor layers 42*a*, 42*b*, 44, 46, 48, 50, 52, 54, 58, and 60 are formed by, for example, printing conductor layers on upper surfaces or lower surfaces of the second insulator layers 40*a* to 40*d*.

The second interlayer connection conductors v10 to v14 are provided in the second substrate portion body 40. The second interlayer connection conductors v10 to v14 are via hole conductors. The second interlayer connection conductors v10 to v14 are preferably formed by, for example, filling through-holes provided in the second insulator layers 40*a* to 40*d* with conductive paste containing a metal, such as silver, and resin and sintering the conductive paste by heating. Note that filling of the through-holes with the conductive paste is performed, for example, at the same time as the printing of the second conductor layers 42*a*, 42*b*, 44, 46, 48, 50, 52, 54, 58, and 60 with conductive paste.

The second substrate portion 14 will next be described in more detail. The capacitance component C in FIG. 2 includes the second conductor layers 42*a* and 42*b* provided in the second substrate portion 14. The second conductor layer 42*a* is provided on the lower surface of the second insulator layer 40*b*. The second conductor layer 42*b* is provided on the lower surface of the second insulator layer 40*c*. The second conductor layer 42*a* and the second conductor layer 42*b* overlap with each other as viewed in the downward direction. Note that the second insulator layer 40*c* is provided between the second conductor layer 42*a* and the second conductor layer 42*b*. With this configuration, the second conductor layers 42*a* and 42*b* define a capacitor.

A change in the capacitance component C can be reduced in the multilayer substrate module having the filter function. More particularly, the Young's moduli of the materials for the second insulator layers 40*a* to 40*d* of the second substrate portion 14 are higher than the Young's moduli of the materials for the first insulator layers 20*a* to 20*d* of the first substrate portion 12. For this reason, the second substrate portion 14 is less deformable than the first substrate portion 12. The capacitance component C in FIG. 2 is defined by the second conductor layers 42*a* and 42*b* provided in the second substrate portion 14. That is, the capacitance component C in FIG. 2 is not provided at the first substrate portion 12. With this configuration, even if the first substrate portion 12 is bent in the vertical direction, the second conductor layers 42*a* and 42*b* forming the capacitance component C are unlikely to be deformed. As a result, a change in the capacitance component C can be reduced in the multilayer substrate module 10 having the filter function. This reduces variability of the cutoff frequency that the filter function LPF has.

In the multilayer substrate module 10, a capacitance value of the capacitance component C can be increased. More particularly, the relative dielectric constants of the materials for the second insulator layers 40*a* to 40*d* are higher than the relative dielectric constants of the materials for the first insulator layers 20*a* to 20*d*. The second conductor layers 42*a* and 42*b* holds the second insulator layer 40*c* with a large relative dielectric constant from both sides to define a capacitor. This increases the capacitance value of the capacitance component C.

The second conductor layer 44 is an outer electrode. Thus, a high-frequency signal is input to or output from the second conductor layer 44. The second conductor layer 44 is provided on the lower surface of the second insulator layer 40*d*. The second conductor layer 44 has a rectangular or substantially rectangular shape as viewed in the downward direction.

The second conductor layer 46 is a connection conductor layer. The second conductor layer 46 is provided on the lower surface of the second insulator layer 40*c*. The second conductor layer 46 has a rectangular or substantially rectangular shape as viewed in the downward direction. The second conductor layer 46 overlaps with the second conductor layer 44 as viewed in the downward direction.

The second conductor layer 48 is a connection conductor layer. The second conductor layer 48 is provided on the lower surface of the second insulator layer 40*b*. The second conductor layer 48 has a rectangular or substantially rectangular shape as viewed in the downward direction. A back portion of the second conductor layer 48 overlaps with the second conductor layer 44 as viewed in the downward direction. The second conductor layer 48 is physically connected to the second conductor layer 42a.

The second interlayer connection conductor v10 extends through the second insulator layers 40c and 40d in the vertical direction. The second interlayer connection conductor v10 connects the second conductor layer 44, the second conductor layer 46, and the second conductor layer 48.

The second conductor layer 50 is an outer electrode. Thus, a high-frequency signal is input to or output from the second conductor layer 50. The second conductor layer 50 is provided on the upper surface of the second insulator layer 40a. The second conductor layer 50 has a rectangular or substantially rectangular shape as viewed in the downward direction. The second conductor layer 50 overlaps with a front portion of the second conductor layer 48 as viewed in the downward direction.

The second interlayer connection conductor v11 extends through the second insulator layer 40a in the vertical direction. The second interlayer connection conductor v11 connects the second conductor layer 48 and the second conductor layer 50.

The second conductor layer 58 is an outer electrode. Thus, a high-frequency signal is input to or output from the second conductor layer 58. The second conductor layer 58 is provided on the lower surface of the second insulator layer 40d. The second conductor layer 58 has a rectangular or substantially rectangular shape as viewed in the downward direction. The second conductor layer 58 overlaps with the second conductor layer 42b as viewed in the downward direction.

The second interlayer connection conductor v14 extends through the second insulator layer 40d in the vertical direction. The second interlayer connection conductor v14 connects the second conductor layer 42b and the second conductor layer 58.

The second conductor layer 60 is an outer electrode. Thus, a high-frequency signal is input to or output from the second conductor layer 60. The second conductor layer 60 is provided on the lower surface of the second insulator layer 40d. The second conductor layer 60 has a rectangular or substantially rectangular shape as viewed in the downward direction.

The second conductor layer 56 is a connection conductor layer. The second conductor layer 56 is provided on the lower surface of the second insulator layer 40c. The second conductor layer 56 has a rectangular or substantially rectangular shape as viewed in the downward direction. The second conductor layer 56 overlaps with the second conductor layer 60 as viewed in the downward direction.

The second conductor layer 54 is a connection conductor layer. The second conductor layer 54 is provided on the lower surface of the second insulator layer 40b. The second conductor layer 54 has, for example, an L-shape as viewed in the downward direction. The second conductor layer 54 includes a first end portion and a second end portion. The first end portion of the second conductor layer 54 overlaps with the second conductor layer 56 as viewed in the downward direction.

The second interlayer connection conductor v13 extends through the second insulator layers 40c and 40d in the vertical direction. The second interlayer connection conductor v13 connects the first end portion of the second conductor layer 54, the second conductor layer 56, and the second conductor layer 60.

The second conductor layer 52 is an outer electrode. Thus, a high-frequency signal is input to or output from the second conductor layer 52. The second conductor layer 52 is provided on the upper surface of the second insulator layer 40a. The second conductor layer 52 has a rectangular or substantially rectangular shape as viewed in the downward direction. The second conductor layer 52 overlaps with the second end portion of the second conductor layer 54 as viewed in the downward direction.

The second interlayer connection conductor v12 extends through the second insulator layers 40a and 40b in the vertical direction. The second interlayer connection conductor v12 connects the second conductor layer 52 and the second end portion of the second conductor layer 54.

The second substrate portion 14 with the above-described configuration is mounted on the upper surface of the first substrate portion 12. Specifically, the second conductor layer 44 is preferably fixed to the first conductor layer 32 with solder. The second conductor layer 58 is preferably fixed to the electrode portion 26a with solder, for example. The second conductor layer 60 is preferably fixed to the first conductor layer 34 with solder, for example.

The mount device 16 is, for example, a semiconductor integrated circuit. In the present preferred embodiment, the mount device 16 is preferably a radio-frequency integrated circuit (RFIC). Note that the mount device 16 may alternatively be, for example, a surface acoustic wave filter. The mount device 16 is mounted on an upper surface or a lower surface of the second substrate portion 14. In the present preferred embodiment, the mount device 16 is mounted on the upper surface of the second substrate portion 14, as shown in FIG. 1. The mount device 16 is out of contact with the first substrate portion 12.

More particularly, the mount device 16 includes a mount device body 80 and mounting electrodes 82 and 84, as shown in FIG. 1. The mount device body 80 preferably has a plate shape. The mount device body 80 has an upper surface and a lower surface. The lower surface of the mount device body 80 opposes the second substrate portion 14. The mounting electrodes 82 and 84 are provided only on the lower surface of the mount device body 80. Thus, no mounting electrode is provided on a surface other than the lower surface of the mount device body 80. The mounting electrodes 82 and 84 are respectively fixed to the second conductor layers 50 and 52 with solder.

In the multilayer substrate module 10, connection reliability of the first substrate portion 12, the second substrate portion 14, and the mount device 16 can be improved. More particularly, a material of the first substrate portion body 20 of the first substrate portion 12 is preferably resin, for example. The mount device 16 is, for example, a semiconductor integrated circuit. For this reason, formation accuracy of the outer electrodes of the first substrate portion 12 is significantly different from formation accuracy of the outer electrodes of the mount device 16. The formation accuracy of the outer electrodes of the mount device 16 is higher than the formation accuracy of the outer electrodes of the first substrate portion 12. In this case, it is difficult to directly mount the mount device 16 on the first substrate portion 12. A material of the second substrate portion body 40 of the second substrate portion 14 is preferably ceramic, for example. In this case, formation accuracy of the outer electrodes of the second substrate portion 14 is higher than the formation accuracy of the outer electrodes of the first substrate portion 12 and is lower than the formation accuracy of the outer electrodes of the mount device 16. This makes it possible to mount the mount device 16 on the second substrate portion 14 and facilitates mounting of the second substrate portion 14 on the first substrate portion 12. In this manner, the second substrate portion 14 is used as an interposer. From the foregoing, in the multilayer substrate module 10, the connection reliability of the first substrate portion 12, the second substrate portion 14, and the mount device 16 can be improved.

In the multilayer substrate module 10 as described above, the filter function LPF shown in FIG. 2 is provided. More particularly, the first conductor layers 30a and 30b of the inductance component L are connected to the first conductor layer 24a as the signal conductor. The first conductor layers 30a and 30b of the inductance component L are connected to the first conductor layer 24b as the signal conductor via the first conductor layer 32, the second conductor layers 44 and 50, the mount device 16, the second conductor layer 52, the second conductor layer 60, and the first conductor layer 34. Thus, the first conductor layer 24a as the signal conductor layer, the inductance component L, and the first conductor layer 24b as the signal conductor layer are series-connected in this order.

The first conductor layers 30a and 30b defining the inductance component L are electrically connected to the second conductor layer 42a defining the capacitance component C via the first conductor layer 32 and the second conductor layer 44. The second conductor layer 42b defining the capacitance component C is connected to the first conductor layer 26 that is connected to the ground potential via the second conductor layer 58 and the electrode portion 26a. Since the connection relation as described above is established, the filter function LPF shown in FIG. 2 is provided.

The connector 18 is mounted on the upper surface or a lower surface of the first substrate portion 12, as shown in FIG. 1. In the present preferred embodiment, the connector 18 is mounted on the lower surface of the first substrate portion 12. The connector 18 is mounted on the right end portion of the first substrate portion 12. In the present preferred embodiment, the connector 18 is a coaxial connector. Thus, the connector 18 includes a central conductor (not shown) to which a high-frequency signal is applied and an outer conductor (not shown) which is connected to the ground potential. The central conductor of the connector 18 is preferably fixed to the first conductor layer 70 with solder. The outer conductor of the connector 18 is preferably fixed to the first conductor layer 28 with solder, for example.

The connector 18 is connected to the connector 102. With this configuration, the multilayer substrate module 10 is electrically connected to the circuit board 100.

The multilayer substrate module 10 extends along an upper surface of the circuit board 100 in the left-right direction. Note that the mount device 104 is provided on the upper surface of the board body 101. For this reason, the first substrate portion 12 of the multilayer substrate module 10 extends along a right surface, an upper surface, and a left surface of the mount device 104. For this reason, the first substrate portion 12 is bent at four sites. As described above, the first substrate portion 12 has sections which are bent in the vertical direction.

First Modification

Figure 7:
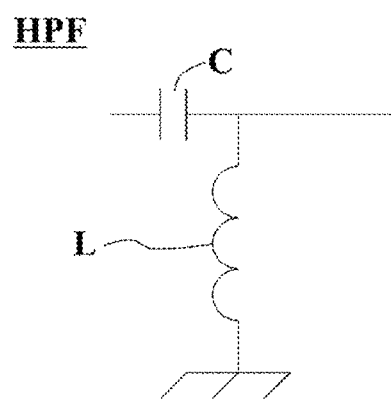
FIG. 7 is an equivalent circuit diagram of a filter function HPF which a multilayer substrate module 10a includes.
Figure 8:
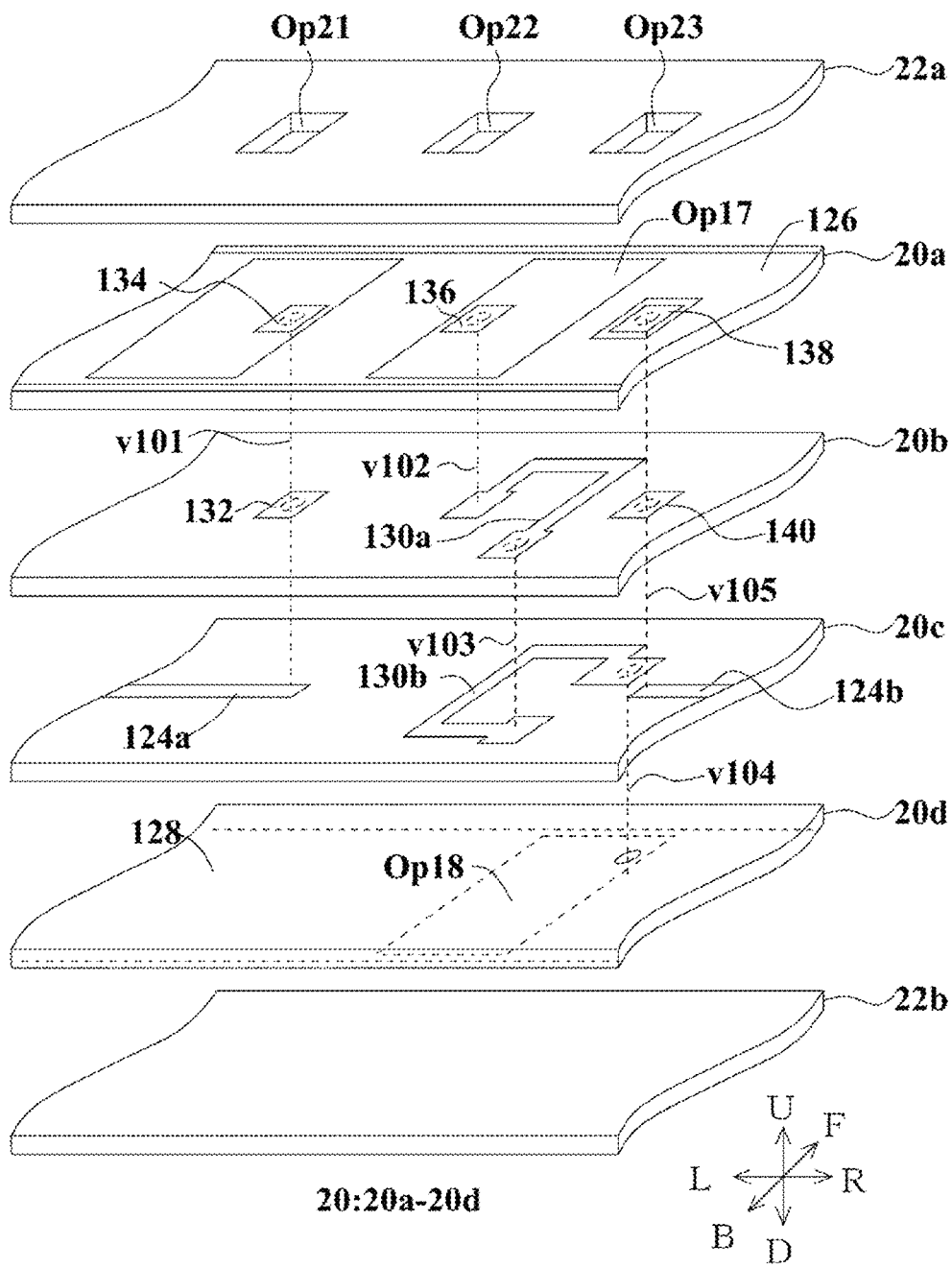
Figure 9:
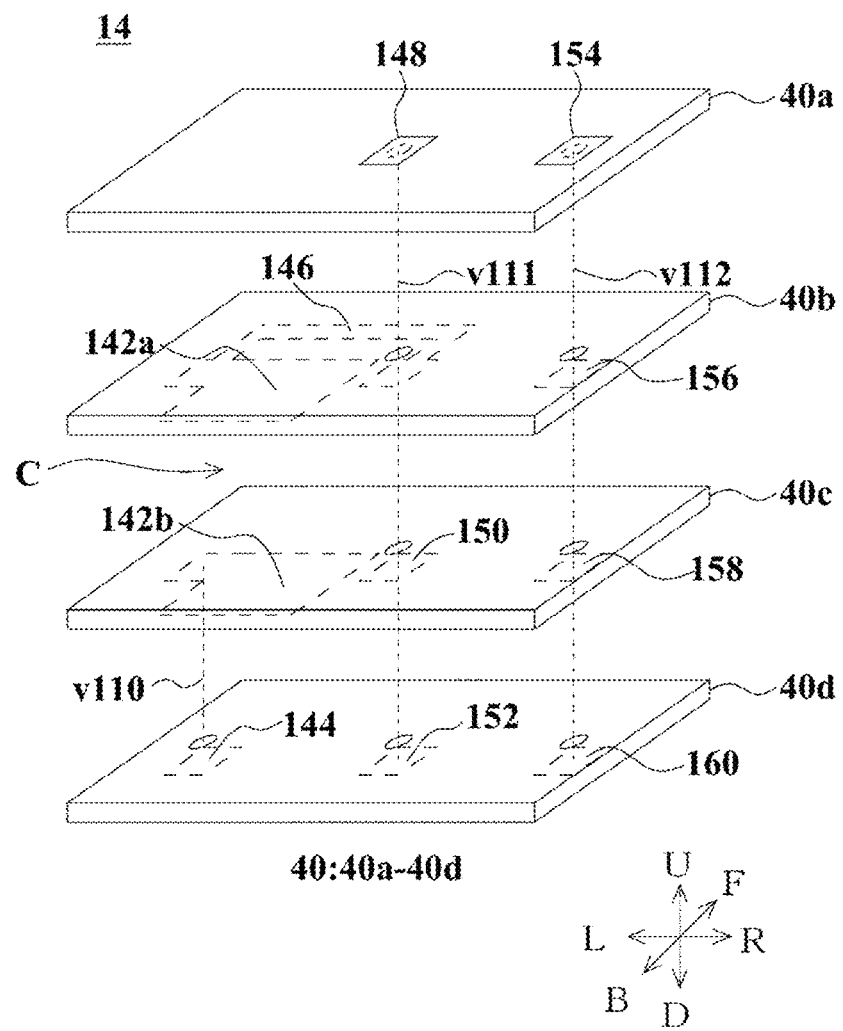

A structure of a multilayer substrate module 10a according to a first modification of a preferred embodiment of the present invention will be described below with reference to the drawings. FIG. 7 is an equivalent circuit diagram of a filter function HPF which the multilayer substrate module 10a includes. FIG. 8 is an exploded perspective view of an intermediate portion of the first substrate portion 12 of the multilayer substrate module 10a. FIG. 9 is an exploded perspective view of the second substrate portion 14 of the multilayer substrate module 10a.

The multilayer substrate module 10a is different from the multilayer substrate module 10 in that the multilayer substrate module 10a has the filter function HPF shown in FIG. 7 instead of the filter function LPF shown in FIG. 2. The filter function HPF is, for example, a high pass filter. Thus, the filter function HPF allows a high-frequency signal having a frequency higher than or equal to a cutoff frequency to pass through. The filter function HPF includes an inductance component L and a capacitance component C, as shown in FIG. 7. The multilayer substrate module 10a will be described below with a focus on such differences.

Details of an intermediate portion of the first substrate portion 12 will be described with reference to FIG. 8. First conductor layers 124a and 124b are signal conductor layers. Thus, a high-frequency signal is transmitted to the first conductor layers 124a and 124b. The first conductor layers 124a and 124b are provided on an upper surface of the first insulator layer 20c. The first conductor layers 124a and 124b have linear shapes as viewed in a downward direction. The first conductor layers 124a and 124b extend in a left-right direction in the middle in a front-back direction of the first insulator layer 20c. The first conductor layer 124a and the first conductor layer 124b are not physically connected. A left end of the first conductor layer 124b is located to the right of a right end of the first conductor layer 124a.

A first conductor layer 126 is a first ground conductor layer. Thus, a ground potential is connected to the first conductor layer 126. The first conductor layer 126 is provided on an upper surface of the first insulator layer 20a. The first conductor layer 126 preferably covers an entirety or substantially an entirety of the upper surface of the first insulator layer 20a. With this configuration, the first conductor layer 126 overlaps with the first conductor layers 124a and 124b as viewed in the downward direction. An opening Op17 is provided in the first conductor layer 126. The opening Op17 is a region where no conductor layer is provided. The opening Op17 has a rectangular or substantially rectangular shape as viewed in the downward direction.

A first conductor layer 128 is a second ground conductor layer. Thus, the ground potential is connected to the first conductor layer 128. The first conductor layer 128 is provided on a lower surface of the first insulator layer 20d. The first conductor layer 128 preferably covers an entirety or substantially an entirety of the lower surface of the first insulator layer 20d. With this configuration, the first conductor layer 128 overlaps with the first conductor layers 124a and 124b as viewed in the downward direction. The first conductor layers 124a and 124b as the signal conductor layers, the first conductor layer 126 as the first ground conductor layer, and the first conductor layer 128 as the second ground conductor layer have a stripline structure. An opening Op18 is provided in the first conductor layer 128. The opening Op18 is a region where no conductor layer is provided. The opening Op18 has a rectangular shape as viewed in the downward direction. The opening Op18 overlaps with the opening Op17 in a state coincident therewith, as viewed in the downward direction.

A first conductor layer 132 is a connection conductor layer. The first conductor layer 132 is provided on an upper surface of the first insulator layer 20b. The first conductor layer 132 overlaps with a right end portion of the first conductor layer 124a as viewed in the downward direction. The first conductor layer 132 has a rectangular or substantially rectangular shape as viewed in the downward direction.

The first conductor layer 134 is an outer electrode. Thus, a high-frequency signal is input to or output from the first conductor layer 134. The first conductor layer 134 is provided on the upper surface of the first insulator layer 20a. The first conductor layer 134 overlaps with the right end portion of the first conductor layer 124a as viewed in the downward direction. The first conductor layer 134 has a rectangular or substantially rectangular shape as viewed in the downward direction.

A first interlayer connection conductor v101 extends through the first insulator layers 20a and 20b in a vertical direction. The first interlayer connection conductor v101 connects the right end portion of the first conductor layer 124a, the first conductor layer 132, and the first conductor layer 134.

The inductance component L in FIG. 7 is defined by first conductor layers 130a and 130b and first interlayer connection conductors v102 and v103 which are provided in the first substrate portion 12. The first conductor layer 130a is provided on the upper surface of the first insulator layer 20b. The first conductor layer 130b is provided on the upper surface of the first insulator layer 20c. The first conductor layer 130a and the first conductor layer 130b overlap with each other to define a rectangular or substantially rectangular trajectory, as viewed in the downward direction. In the following description, end portions on an upstream side in a clockwise direction of the first conductor layers 130a and 130b are defined as upstream end portions. End portions on a downstream side in the clockwise direction of the first conductor layers 130a and 130b are defined as downstream end portions. The downstream end of the first conductor layer 130a overlaps with the upstream end portion of the first conductor layer 130b as viewed in the downward direction. The first conductor layers 130a and 130b overlap with the openings Op17 and Op18 as viewed in the downward direction. With this configuration, the first conductor layers 130a and 130b do not overlap with the first conductor layer 126 as the first ground conductor layer and the first conductor layer 128 as the second ground conductor layer as viewed in the downward direction. This reduces or prevents formation of capacitances between the first conductor layers 130a and 130b and the first conductor layer 126 and between the first conductor layers 130a and 130b and the first conductor layer 128.

The first interlayer connection conductor v103 extends through the first insulator layer 20b in the vertical direction. The first interlayer connection conductor v103 connects the downstream end portion of the first conductor layer 130a and the upstream end portion of the first conductor layer 130b. With this configuration, the first conductor layer 130a and the first conductor layer 130b are series-connected via the first interlayer connection conductor v103.

The first conductor layer 136 is an outer electrode. Thus, a high-frequency signal is input to or output from the first conductor layer 136. The first conductor layer 136 is provided on the upper surface of the first insulator layer 20a. The first conductor layer 136 overlaps with the upstream end portion of the first conductor layer 130a as viewed in the downward direction. The first conductor layer 136 has a rectangular or substantially rectangular shape as viewed in the downward direction.

The first interlayer connection conductor v102 extends through the first insulator layer 20a in the vertical direction. The first interlayer connection conductor v102 connects the upstream end portion of the first conductor layer 130a and the first conductor layer 136. As described above, the first conductor layers 130a and 130b and the first interlayer connection conductors v102 and v103 have a helical shape including a central axis extending in the vertical direction. That is, the first conductor layers 130a and 130b and the first interlayer connection conductors v102 and v103 preferably define a coil.

A first interlayer connection conductor v104 extends through the first insulator layers 20c and 20d in the vertical direction. The first interlayer connection conductor v104 connects the downstream end portion of the first conductor layer 130b and the first conductor layer 128.

The first conductor layer 138 is an outer electrode. Thus, a high-frequency signal is input to or output from the first conductor layer 138. The first conductor layer 138 is provided on the upper surface of the first insulator layer 20a. The first conductor layer 138 is arranged to the right of the first conductor layer 136. The first conductor layer 138 overlaps with a left end portion of the first conductor layer 124b as viewed in the downward direction. The first conductor layer 138 has a rectangular or substantially rectangular shape as viewed in the downward direction.

A first conductor layer 140 is a connection conductor layer. The first conductor layer 140 is provided on the upper surface of the first insulator layer 20b. The first conductor layer 140 overlaps with the left end portion of the first conductor layer 124b and the first conductor layer 138 as viewed in the downward direction. The first conductor layer 140 has a rectangular or substantially rectangular shape as viewed in the downward direction.

A first interlayer connection conductor v105 extends through the first insulator layers 20a and 20b in the vertical direction. The first interlayer connection conductor v105 connects the first conductor layer 138, the first conductor layer 140, and the left end portion of the first conductor layer 124b.

Openings Op21, Op22, and Op23 are provided in the resist layer 22a, as shown in FIG. 8. The opening Op21 overlaps with the first conductor layer 134 as viewed in the downward direction. The opening Op22 overlaps with the first conductor layer 136 as viewed in the downward direction. The opening Op23 overlaps with the first conductor layer 138 as viewed in the downward direction. With this configuration, the first conductor layers 134, 136, and 138 are exposed to the outside of the first substrate portion 12.

Note that a left end portion and a right end portion of the first substrate portion 12 of the multilayer substrate module 10a preferably have the same structures as the left end portion and the right end portion of the first substrate portion 12 of the multilayer substrate module 10. Thus, a description of the left end portion and the right end portion of the first substrate portion 12 of the multilayer substrate module 10a will be omitted.

Details of the second substrate portion 14 will next be described with reference to FIG. 9. The second substrate portion 14 is provided on an upper surface of the first substrate portion 12. The second substrate portion 14 includes the second substrate portion body 40, second conductor layers 142a, 142b, 144, 146, 148, 150, 152, 154, 156, 158, and 160, and second interlayer connection conductors v110 to v112.

The second substrate portion body 40 of the multilayer substrate module 10a is preferably the same or substantially the same as the second substrate portion body 40 of the multilayer substrate module 10. Thus, a description of the second substrate portion body 40 of the multilayer substrate module 10a will be omitted.

The second conductor layers 142a, 142b, 144, 146, 148, 150, 152, 154, 158, and 160 are provided at the second substrate portion body 40. The second conductor layers 142a, 142b, 144, 146, 148, 150, 152, 154, 156, 158, and 160 are preferably defined by, for example, printing conductor layers on upper surfaces or lower surfaces of the second insulator layers 40a to 40d.

The second interlayer connection conductors v110 to v112 are provided in the second substrate portion body 40. The second interlayer connection conductors v110 to v112 are preferably via hole conductors. The second interlayer connection conductors v110 to v112 are formed by, for example, filling through-holes provided in the second insulator layers 40a to 40d with conductive paste containing a metal, such as silver, and resin and solidifying the conductive paste by heating.

The second substrate portion 14 will next be described in more detail. The capacitance component C in FIG. 7 is defined by the second conductor layers 142a and 142b provided in the second substrate portion 14. The second conductor layer 142a is provided on the lower surface of the second insulator layer 40b. The second conductor layer 142b is provided on the lower surface of the second insulator layer 40c. The second conductor layer 142a and the second conductor layer 142b overlap with each other as viewed in the downward direction. The second insulator layer 40c is provided between the second conductor layer 142a and the second conductor layer 142b. With this configuration, the second conductor layers 142a and 142b define a capacitor.

The second conductor layer 144 is an outer electrode. Thus, a high-frequency signal is input to or output from the second conductor layer 144. The second conductor layer 144 is provided on the lower surface of the second insulator layer 40d. The second conductor layer 144 has a rectangular or substantially rectangular shape as viewed in the downward direction. The second conductor layer 144 overlaps with the second conductor layer 142b as viewed in the downward direction.

The second interlayer connection conductor v110 extends through the second insulator layer 40d in the vertical direction. The second interlayer connection conductor v110 connects the second conductor layer 142b and the second conductor layer 144.

The second conductor layer 152 is an outer electrode. Thus, a high-frequency signal is input to or output from the second conductor layer 152. The second conductor layer 152 is provided on the lower surface of the second insulator layer 40d. The second conductor layer 152 has a rectangular or substantially rectangular shape as viewed in the downward direction.

The second conductor layer 150 is a connection conductor layer. The second conductor layer 150 is provided on the lower surface of the second insulator layer 40c. The second conductor layer 150 has a rectangular shape as viewed in the downward direction. The second conductor layer 150 overlaps with the second conductor layer 152 as viewed in the downward direction.

The second conductor layer 146 is a connection conductor layer. The second conductor layer 146 is provided on the lower surface of the second insulator layer 40b. The second conductor layer 146 has a linear shape. The second conductor layer 146 has a third end portion and a fourth end portion. The third end portion of the second conductor layer 146 is connected to the second conductor layer 142a. The fourth end portion of the second conductor layer 146 overlaps with the second conductor layers 150 and 152 as viewed in the downward direction.

The second conductor layer 148 is an outer electrode. Thus, a high-frequency signal is input to or output from the second conductor layer 148. The second conductor layer 148 is provided on the upper surface of the second insulator layer 40a. The second conductor layer 148 has a rectangular or substantially rectangular shape as viewed in the downward direction. The second conductor layer 148 overlaps with the fourth end portion of the second conductor layer 146, the second conductor layer 150, and the second conductor layer 152 as viewed in the downward direction.

The second interlayer connection conductor v111 extends through the second insulator layers 40a to 40d in the vertical direction. The second interlayer connection conductor v111 connects the fourth end portion of the second conductor layer 146, the second conductor layer 148, the second conductor layer 150, and the second conductor layer 152.

The second conductor layer 160 is an outer electrode. Thus, a high-frequency signal is input to or output from the second conductor layer 160. The second conductor layer 160 is provided on the lower surface of the second insulator layer 40d. The second conductor layer 160 has a rectangular or substantially rectangular shape as viewed in the downward direction.

The second conductor layer 158 is a connection conductor layer. The second conductor layer 158 is provided on the lower surface of the second insulator layer 40c. The second conductor layer 158 has a rectangular or substantially rectangular shape as viewed in the downward direction. The second conductor layer 158 overlaps with the second conductor layer 160 as viewed in the downward direction.

A second conductor layer 156 is a connection conductor layer. The second conductor layer 156 is provided on the lower surface of the second insulator layer 40b. The second conductor layer 156 has a rectangular or substantially rectangular shape as viewed in the downward direction. The second conductor layer 156 overlaps with the second conductor layers 158 and 160 as viewed in the downward direction.

The second conductor layer 154 is an outer electrode. Thus, a high-frequency signal is input to or output from the second conductor layer 154. The second conductor layer 154 is provided on the upper surface of the second insulator layer 40a. The second conductor layer 154 has a rectangular or substantially rectangular shape as viewed in the downward direction. The second conductor layer 154 overlaps with the second conductor layers 156, 158, and 160 as viewed in the downward direction.

The second interlayer connection conductor v112 extends through the second insulator layers 40a to 40d in the vertical direction. The second interlayer connection conductor v112 connects the second conductor layer 154, the second conductor layer 156, the second conductor layer 158, and the second conductor layer 160.

The second substrate portion 14 with the above-described configuration is mounted on the upper surface of the first substrate portion 12. Specifically, the second conductor layer 144 is preferably fixed to the first conductor layer 134 with solder. The second conductor layer 152 is preferably fixed to the first conductor layer 136 with solder, for example. The second conductor layer 160 is preferably fixed to the first conductor layer 138 with solder, for example.

The mount device 16 of the multilayer substrate module 10a is the same or substantially the same as the mount device 16 of the multilayer substrate module 10. Thus, a description of the mount device 16 of the multilayer substrate module 10a will be omitted.

In the multilayer substrate module 10a as described above, the filter function HPF shown in FIG. 7 is provided. More particularly, the second conductor layer 142b defining the capacitance component C is connected to the first conductor layer 124a as the signal conductor via the first conductor layer 134 and the second conductor layer 144. The second conductor layer 142a defining the capacitance component C is connected to the first conductor layer 124b as the signal conductor via the second conductor layer 148, the mount device 16, the second conductor layers 154 and 160, and the first conductor layer 138. Thus, the first conductor layer 124a as the signal conductor layer, the capacitance component C, and the first conductor layer 124b as the signal conductor layer are series-connected in this order.

The first conductor layers 130a and 130b defining the inductance component L are electrically connected to the second conductor layer 142a defining the capacitance component C via the first conductor layer 136 and the second conductor layer 152. The first conductor layers 130a and 130b defining the inductance component L are electrically connected to the first conductor layer 128 that is connected to the ground potential. Since the connection relation as described above is established, the filter function HPF shown in FIG. 7 is provided.

The connector 18 of the multilayer substrate module 10a is preferably the same or substantially the same as the connector 18 of the multilayer substrate module 10. Thus, a description of the connector 18 of the multilayer substrate module 10a will be omitted.

Second Modification

Figure 10:
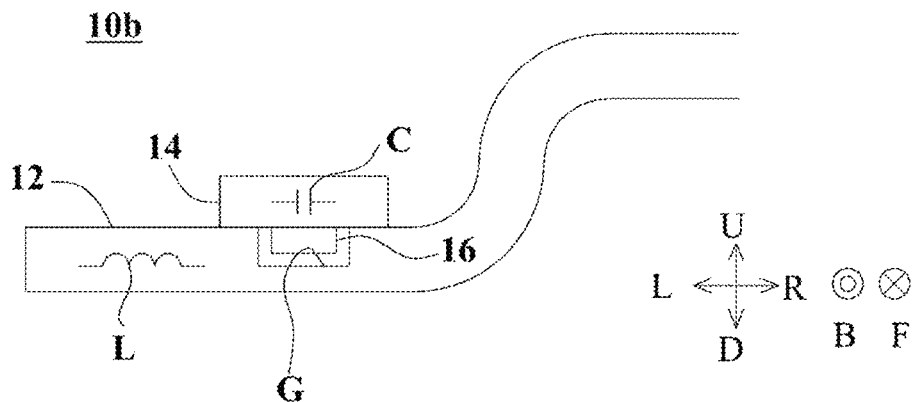
FIG. 10 is a schematic view of a multilayer substrate module 10b.

A structure of a multilayer substrate module 10b according to a second modification of a preferred embodiment of the present invention will be described below with reference to the drawing. FIG. 10 is a schematic view of the multilayer substrate module 10b.

The multilayer substrate module 10b is different from the multilayer substrate module 10 in that the mount device 16 is provided on a lower surface of the second substrate portion 14. More particularly, a depression G is provided in an upper surface of the first substrate portion 12. The second substrate portion 14 is mounted on the upper surface of the first substrate portion 12 so as to seal the depression G. The mount device 16 is mounted on the lower surface of the second substrate portion 14. With this configuration, the mount device 16 is housed in the depression G. In this case, the mount device 16 is out of contact with an inner peripheral surface of the depression G. Thus, the mount device 16 is out of contact with the first substrate portion 12. In the multilayer substrate module 10b as described above, a height in a vertical direction of the multilayer substrate module 10b can be reduced.

Third Modification

Figure 11:
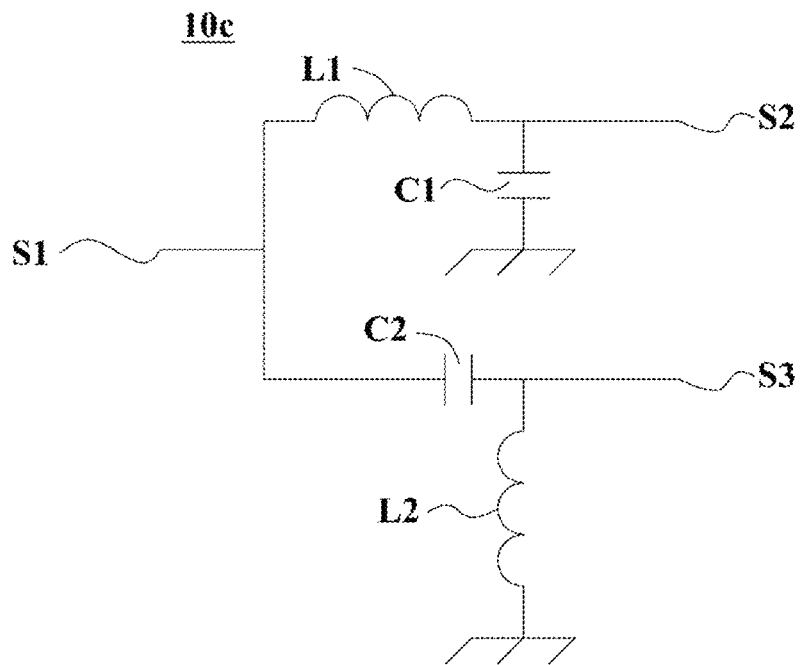
FIG. 11 is an equivalent circuit diagram of a multilayer substrate module 10c.

A structure of a multilayer substrate module 10c according to a third modification of a preferred embodiment of the present invention will be described below with reference to the drawing. FIG. 11 is an equivalent circuit diagram of the multilayer substrate module 10c.

The multilayer substrate module 10c is preferably used as a diplexer. Thus, the multilayer substrate module 10c has a structure in which one first signal path S1 branches into a second signal path S2 and a third signal path S3. A filter function of the multilayer substrate module 10c includes a low pass filter and a high pass filter. The low pass filter is provided in the second signal path S2. The high pass filter is provided in the third signal path S3. A capacitance component C1 of the low pass filter and a capacitance component C2 of the high pass filter are defined by second conductor layers and/or second interlayer connection conductors which are provided in the second substrate portion 14. This curbs a change in a capacitance value of the capacitance component C1 and a capacitance value of the capacitance component C2. As a result, variability of a cutoff frequency of the low pass filter and variability of a cutoff frequency of the high pass filter are reduced.

Other Preferred Embodiments

Signal transmission lines according to preferred embodiments of the present invention are not limited to the multilayer substrate modules 10 and 10a to 10c, and the multilayer substrate modules 10 and 10a to 10c can be changed within the scope of the present invention. Components of the multilayer substrate modules 10 and 10a to 10c can be combined.

An entirety or substantially an entirety of the inductance component L, L1, or L2 need not be provided in the first substrate portion 12 in each of the multilayer substrate modules 10 and 10a to 10c. That is, at least a portion of the inductance component L, L1, or L2 only needs to be provided in the first substrate portion 12.

The inductance component L, L1, or L2 only needs to be defined by a first conductor layer and/or a first interlayer connection conductor in each of the multilayer substrate modules 10 and 10a to 10c. Thus, the inductance component L, L1, or L2 may be defined by a first conductor layer, may be defined by a first interlayer connection conductor, or may be defined by a combination of a first conductor layer and a first interlayer connection conductor.

The capacitance component C, C1, or C2 only needs to be defined by a second conductor layer and/or a second interlayer connection conductor in each of the multilayer substrate modules 10 and 10a to 10c. Thus, the capacitance component C, C1, or C2 may be defined by a second conductor layer, may be defined by a second interlayer connection conductor, or may be defined by a combination of a second conductor layer and a second interlayer connection conductor.

The first substrate portion 12 only needs to include a first conductor layer and/or a first interlayer connection conductor in each of the multilayer substrate modules 10 and 10a to 10c. Thus, the first substrate portion 12 may include a first conductor layer, may include a first interlayer connection conductor, or may include a first conductor layer and a first interlayer connection conductor.

The second substrate portion 14 only needs to include a second conductor layer and/or a second interlayer connection conductor in each of the multilayer substrate modules 10 and 10a to 10c. Thus, the second substrate portion 14 may include a second conductor layer, may include a second interlayer connection conductor, or may include a second conductor layer and a second interlayer connection conductor.

The mount device 16 may be in contact with the first substrate portion 12 in each of the multilayer substrate modules 10 and 10a to 10c.

The materials for the second insulator layers 40a to 40d may be materials other than ceramic in each of the multilayer substrate modules 10 and 10a to 10c. The materials other than ceramic are, for example, glass epoxy.

A second substrate portion may be provided on the lower surface of the first substrate portion 12 in addition to the upper surface of the first substrate portion 12 in each of the multilayer substrate modules 10 and 10a to 10c. In this case, the two second substrate portions may overlap but need not overlap as viewed in the downward direction.

The relative dielectric constants of the materials for the second insulator layers 40a to 40d may be lower than or equal to the relative dielectric constants of the materials for the first insulator layers 20a to 20d in each of the multilayer substrate modules 10 and 10a to 10c.

The connector 18 is not required in each of the multilayer substrate modules 10 and 10a to 10c.

A first conductor layer need not include at least one of a first ground conductor layer, a second ground conductor layer, and a signal conductor layer in each of the multilayer substrate modules 10 and 10a to 10c.

A first conductor layer need not include an antenna conductor layer in each of the multilayer substrate modules 10 and 10a to 10c. In this case, the one of the multilayer substrate modules 10 and 10a to 10c is used not as a front-end module but as, for example, a signal transmission line connecting two circuit boards.

The mount device 16 may include a mounting electrode which is provided on a surface other than an upper surface or a lower surface opposing the second substrate portion 14 in each of the multilayer substrate modules 10 and 10a to 10c.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate module that has a filter function including an inductance component and a capacitance component, the multilayer substrate module comprising:
    a first substrate portion including a first substrate portion body including a plurality of first insulator layers stacked in a vertical direction and a first conductor layer and/or a first interlayer connection conductor provided at the first substrate portion body;
    a second substrate portion including a second substrate portion body including a plurality of second insulator layers stacked in the vertical direction and a second conductor layer and/or a second interlayer connection conductor provided at the second substrate portion body, the second substrate portion being mounted on an upper surface of the first substrate portion; and
    a mount device mounted on an upper surface or a lower surface of the second substrate portion; wherein
    at least a portion of the inductance component is defined by the first conductor layer and/or the first interlayer connection conductor provided in the first substrate portion;
    the capacitance component is defined by the second conductor layer and/or the second interlayer connection conductor that is provided in the second substrate portion; and
    a Young's modulus of a material of the plurality of second insulator layers is higher than a Young's modulus of a material of the plurality of first insulator layers.

2. The multilayer substrate module according to claim 1, wherein the mount device is out of contact with the first substrate portion.

3. The multilayer substrate module according to claim 1, wherein the mount device is a semiconductor integrated circuit.

4. The multilayer substrate module according to claim 3, wherein the mount device is a radio-frequency integrated circuit (RFIC).

5. The multilayer substrate module according to claim 1, wherein the first substrate portion body has flexibility.

6. The multilayer substrate module according to claim 5, wherein the material of the plurality of first insulator layers is resin.

7. The multilayer substrate module according to claim 1, wherein the material of the plurality of second insulator layers is ceramic.

8. The multilayer substrate module according to claim 1, wherein a relative dielectric constant of the material of the plurality of second insulator layers is higher than a relative dielectric constant of the material of the plurality of first insulator layers.

9. The multilayer substrate module according to claim 1, wherein the first substrate portion includes a section that is bent in the vertical direction.

10. The multilayer substrate module according to claim 1, further comprising a connector mounted on the upper surface of the first substrate portion or a lower surface of the first substrate portion.

11. The multilayer substrate module according to claim 1, wherein the first conductor layer includes a first ground conductor layer.

12. The multilayer substrate module according to claim 11, wherein
    the first conductor layer includes a signal conductor layer and a second ground conductor layer; and
    the signal conductor layer, the first ground conductor layer, and the second ground conductor layer include a stripline structure.

13. The multilayer substrate module according to claim 1, wherein the first conductor layer includes an antenna conductor layer.

14. The multilayer substrate module according to claim 1, wherein the multilayer substrate module is a diplexer.

15. The multilayer substrate module according to claim 14, wherein
    a filter function of the diplexer includes a low pass filter and a high pass filter; and
    a capacitance component of the low pass filter and a capacitance component of the high pass filter are defined by the second conductor layer and/or the second interlayer connection conductor that is provided in the second substrate portion.

16. The multilayer substrate module according to claim 1, wherein the mount device includes:
    a mount device body; and
    a mounting electrode provided only on an upper surface or a lower surface opposing the second substrate portion of the mount device.

17. The multilayer substrate module according to claim 1, further comprising at least one resist layer at least partially covering one of the plurality of first insulator layers.

18. The multilayer substrate module according to claim 1, wherein the first interlayer connection conductor and the second interlayer connection conductor are defined by via hole conductors.

19. The multilayer substrate module according to claim 1, wherein an opening is provided in the first conductor layer.

20. The multilayer substrate module according to claim 1, wherein the first conductor layer and the first interlayer connection conductor define portions of a coil.

* * * * *